US008539289B2

(12) United States Patent
Tan et al.

(10) Patent No.: US 8,539,289 B2
(45) Date of Patent: Sep. 17, 2013

(54) MEMORY TESTING SYSTEM AND METHOD OF COMPUTING DEVICE

(75) Inventors: Jie-Jun Tan, Shenzhen (CN); Yu-Long Lin, Shenzhen (CN); Hua Dong, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 65 days.

(21) Appl. No.: 13/313,006

(22) Filed: Dec. 7, 2011

(65) Prior Publication Data

US 2012/0331345 A1  Dec. 27, 2012

(30) Foreign Application Priority Data

Jun. 24, 2011  (CN) .......................... 2011 1 0173062

(51) Int. Cl.
*G11C 29/00*  (2006.01)
(52) U.S. Cl.
USPC .............. 714/721; 714/32; 714/42; 714/47.2; 714/48; 714/718; 714/723; 714/745; 714/733; 714/734; 714/742; 714/746
(58) Field of Classification Search
None
See application file for complete search history.

(56) References Cited

U.S. PATENT DOCUMENTS

| 7,616,484 | B2 * | 11/2009 | Auclair et al. | ........... | 365/185.09 |
| 8,077,515 | B2 * | 12/2011 | Shen et al. | ............... | 365/185.09 |
| 2005/0043912 | A1 * | 2/2005 | Kang et al. | .................... | 702/117 |
| 2008/0151661 | A1 * | 6/2008 | Takai | .......................... | 365/201 |
| 2009/0271678 | A1 * | 10/2009 | Schneider et al. | ............ | 714/746 |
| 2010/0174955 | A1 * | 7/2010 | Carnevale et al. | ............ | 714/718 |
| 2011/0083039 | A1 * | 4/2011 | Kim et al. | .................... | 714/6.13 |
| 2011/0107161 | A1 * | 5/2011 | Eguchi et al. | ................. | 714/721 |
| 2011/0179321 | A1 * | 7/2011 | Takeuchi | ..................... | 714/718 |
| 2012/0314499 | A1 * | 12/2012 | Yuan et al. | ............... | 365/185.11 |

* cited by examiner

*Primary Examiner* — John Trimmings
(74) *Attorney, Agent, or Firm* — Altis Law Group, Inc.

(57) ABSTRACT

In a memory testing method for testing a memory module of a computing device, an operating voltage of the memory module is adjusted to a first voltage or a second voltage. A predetermined data set is written into the memory module after the operating voltage of the memory module is adjusted, and the written data set is read out from the memory module, to accomplish a data writing and reading process of the memory module. A register value that presents how many memory errors have occurred during the data writing and reading process is acquired from an ECC register of the memory module, to determine whether the memory module is stable during the adjusting of the operating voltage according to the register value.

15 Claims, 2 Drawing Sheets

MEMORY TESTING SYSTEM AND METHOD OF COMPUTING DEVICE

BACKGROUND

1. Technical Field

Embodiments of the present disclosure relate generally to memory testing technologies, and particularly to a memory testing system and method for testing an memory module of a computing device.

2. Description of Related Art

A memory error often occurs during data transmission of a memory module of a computing device. Since the memory error may cause the computing device to crash, it is necessary to test the memory module once the memory module has been installed in the computing device. In a typical memory module testing method, the memory module is tested based on a stable operating voltage. However, the operating voltage of the memory module may be changed due to some unexpected factors, such as a failure of a component of a motherboard. Therefore, a more efficient testing system and method is desired to detect whether the memory module is stable when the voltage of the memory module is changed.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
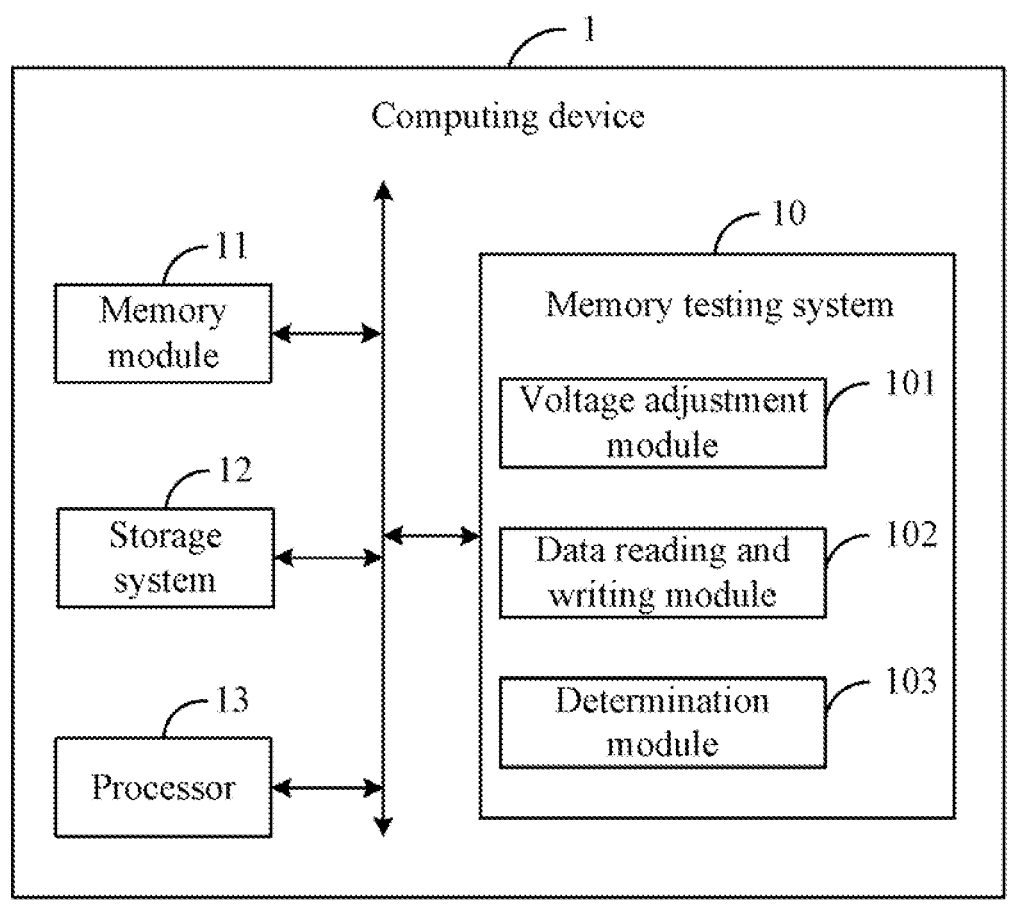
FIG. 1 is a schematic diagram illustrating one embodiment of a computing device comprising a memory testing system.

FIG. 1 is a schematic diagram illustrating one embodiment of a computing device 1 comprising a memory testing system 10 The computing device 1 further comprises a memory module 11, a storage system 12, and a processor 13. The memory testing system 10 tests the memory module 11 to detect whether the memory module 11 is stable by changing an operating voltage of the memory module 11. In one embodiment, the memory module 11 is an error checking and correcting (ECC) memory module that can automatically check and correct memory errors. It is understood that the memory module 11 can refer to one or more memory modules depending on the embodiment. It is further understood that FIG. 1 is only one example of the computing device 1 that can include more or fewer components than those shown in the embodiment, or a different configuration of the various components.

The storage system 12 stores one or more programs, such as programs of a firmware or other applications of the computing device 1 and executed by the processor 13 to provide functions of the computing device 1. In one embodiment, the storage system 12 may be a random access memory (RAM) for temporary storage of information, and/or a read only memory (ROM) for permanent storage of information. In other embodiments, the storage system 12 may also be an external storage device, such as a hard disk, a storage card, or a data storage medium.

The memory testing system 10 may include a plurality of software programs in the form of one or more computerized instructions stored in the storage system 12 and executed by the processor 13, to perform operations of the computing device 1. In the embodiment, the memory testing system 10 includes a voltage adjustment module 101, a data reading and writing module 102, and a determination module 103. In general, the word "module", as used herein, refers to logic embodied in hardware or firmware, or to a collection of software instructions, written in a programming language, such as, Java, C, or assembly. One or more software instructions in the modules may be embedded in firmware, such as in an EPROM. The modules described herein may be implemented as either software and/or hardware modules and may be stored in any type of non-transitory computer-readable medium or other storage device. Some non-limiting examples of non-transitory computer-readable medium include CDs, DVDs, BLU-RAY, flash memory, and hard disk drives.

The voltage adjusting module 101 adjusts the operating voltage of the memory module 11 to a first voltage. In the embodiment, the operating voltage of the memory module is a stub series terminated logic (SSTL) voltage. The first voltage is V+Vr, where the V is a nominal operating voltage or a standard operating voltage of the memory module 11, and the Vr is predetermined according to a range of the operating voltage of the memory module 11. For example, if the nominal operating voltage or the standard operating voltage V is 3.3V, and the range of the operating voltage is 3.3V±0.2V, the Vr can be predetermined as 0.1V.

The data reading and writing module 102 writes a predetermined data set into the memory module 11 after the operating voltage of the memory module 11 is adjusted to the first voltage, and reads out the written data set from the memory module 11, to accomplish a data writing and reading process of the memory module 11. In the embodiment, the memory module 11 may automatically check and correct memory errors (data errors) occurred in during the data writing and reading process using an ECC function of the memory module 11. If the memory errors are checked and are corrected, the memory module 11 may record how many memory errors are in an ECC register of the memory module 11.

The voltage adjustment module 101 further adjusts the operating voltage of the memory module 11 to a second value, where the second value is V−Vr.

The data reading and writing module 102 further writes the data set into the memory module 11 when the operating voltage of the memory module 11 is adjusted to the second voltage, and reads out the written data set from the memory module 11.

The determination module 103 acquires a register value of the ECC register of the memory module 11 after the data writing and reading process is accomplished under the second voltage, and determines whether the memory module 11 is stable during the changing of the operating voltage of the memory module 11 according to the register value. In the embodiment, the register value represents how many memory errors are in the memory module 11 during the data writing and reading process of the memory module 11. If the register value is equal to or less than a predefined value, such as a digital number "0", the determination module 103 determines that the memory module 11 is stable because no memory errors occurred during the data writing and reading process. If the register value is greater than the predefined value "0", the determination module 103 determines that the memory module 11 is unstable because one or more memory errors have occurred during the data writing and reading process. In addition, the determination module 103 further generates a test result indicating the amount of the memory errors that have occurred after the data writing and reading process is accomplished under the second voltage if the memory module 11 is determined to be unstable.

Figure 2:
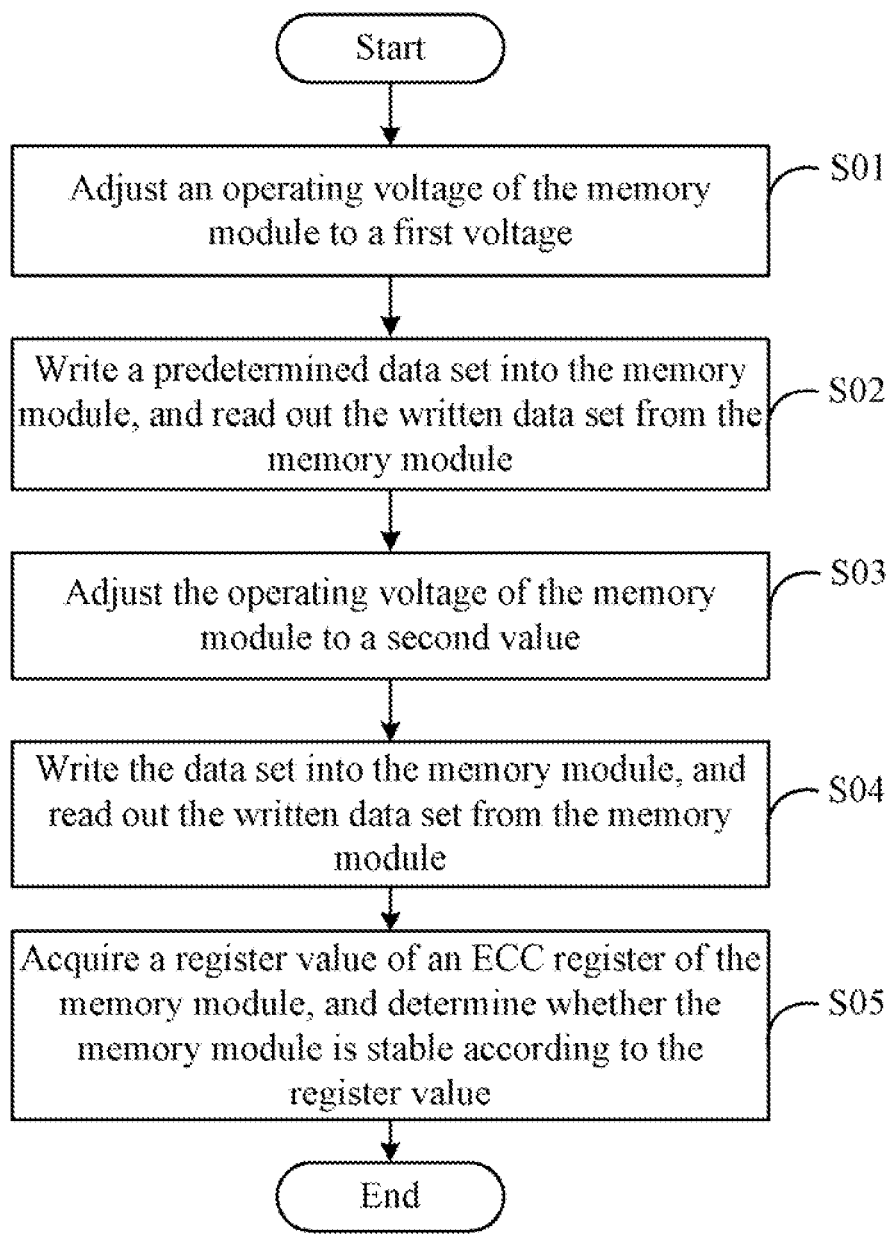
FIG. 2 is a flowchart of one embodiment of a memory testing method for testing a memory module of the computing device of FIG. 1.

FIG. 2 is a flowchart of one embodiment of a memory testing method of the computing device 1 of FIG. 1. Depending on the embodiment, additional blocks may be added, others removed, and the ordering of the blocks may be changed.

In block S01, the voltage adjusting module 101 adjusts the operating voltage of the memory module 11 to a first voltage. In the embodiment, the operating voltage of the memory module is a stub series terminated logic (SSTL) voltage. The first voltage is V+Vr, where V is a nominal operating voltage or a standard operating voltage of the memory module 11, Vr is predetermined according to a range of the operating voltage of the memory module 11. The operating voltage of the memory module 11 may be adjusted through a basic input output system (BIOS) of the computing device.

In block S02, the data reading and writing module 102 writes a predetermined data set into the memory module 11, and reads out the written data set from the memory module 11, to accomplish a data writing and reading process of the memory module 11.

In block S03, the voltage adjustment module 101 adjusts the operating voltage of the memory module 11 to a second value, where the second value is V−Vr.

In block S04, the data reading and writing module 102 writes the data set into the memory module 11, and reads out the written data set from the memory module 11.

In block S05, the determination module 103 acquires a register value of the ECC register of the memory module 11 after the data writing and reading process is accomplished under the second voltage, and determines whether the memory module 11 is stable during the changing of the operating voltage of the memory module 11 according to the register value. In addition, the determination module 103 further generates a test result indicating the amount of the memory errors that have occurred after the data writing and reading process is accomplished under the second voltage if the memory module 11 is determined to be unstable. In the embodiment, if the register value is equal to or less than a predefined value, such as a digital number "0", the determination module 103 determines that the memory module 11 is stable because no memory error occurred during the data writing and reading process. If the register value is greater than the predefined value "0", the determination module 103 determines that the memory module 11 is unstable because one or more memory errors have occurred during the data writing and reading process.

Although certain embodiments of the present disclosure have been specifically described, the present disclosure is not to be construed as being limited thereto. Various changes or modifications may be made to the present disclosure without departing from the scope and spirit of the present disclosure.

What is claimed is:

1. A memory testing method for testing a memory module of a computing device, the method comprising:
   adjusting an operating voltage of the memory module to a first voltage;
   writing a predetermined data set into the memory module, and reading out the written data set from the memory module when the operating voltage of the memory module is adjusted to the first voltage, to accomplish a data writing and reading process of the memory module;
   adjusting the operating voltage of the memory module to a second value;
   writing the data set into the memory module, and reading out the written data set from the memory module when the operating voltage of the memory module is adjusted to the second value;
   acquiring a register value of an error checking and correcting (ECC) register of the memory module after the data writing and reading process is accomplished under the second value, wherein: the first voltage is V+Vr, and the second value is V−Vr, V is a nominal operating voltage or a standard operating voltage of the memory module, and Vr is predetermined according to a range within the operating voltage of the memory module;
   determining whether the memory module is stable during the adjusting of the operating voltage of the memory module according to the register value; and
   generating a test result indicating how many memory errors have occurred after the data writing and reading process is accomplished under the second value if the memory module is determined to be unstable.

2. The method according to claim 1, wherein the memory module is determined to be stable if the register value is equal to or less than a predefined value, and wherein the memory module is determined to be unstable if the register value is greater than the predefined value.

3. The method according to claim 1, wherein the operating voltage of the memory module is adjusted through a basic input output system (BIOS) of the computing device.

4. The method according to claim 1, wherein the memory module is an ECC memory module that automatically checks and corrects the memory errors occurred during the data writing and reading process using an ECC function.

5. The method according to claim 1, wherein the register value of the ECC register represents how many memory errors that have occurred during the data writing and reading process.

6. A computing device, comprising:
   a memory module;
   a storage system;
   at least one processor;
   one or more programs stored in the storage system and being executable by the at least one processor, the one or more programs comprising:
   a voltage adjustment module operable to adjust an operating voltage of the memory module to a first voltage, and adjust the operating voltage of the memory module to a second voltage, wherein: the first voltage is V+Vr, and the second voltage is V−Vr, V is a nominal operating voltage or a standard operating voltage of the memory module, and Vr is predetermined according to a range within the operating voltage of the memory module;
   a data reading and writing module operable to write a predetermined data set into the memory module, and reading out the written data set from the memory module when the operating voltage of the memory module is adjusted, to accomplish a data writing and reading process of the memory module; and
   a determination module operable to acquire a register value of an error checking and correcting (ECC) register of the memory module after the data writing and reading process is accomplished under the second voltage, and determine whether the memory module is stable during the adjusting of the operating voltage of the memory module according to the register value, and generate a test result indicating how many memory errors have occurred after the data writing and reading process is accomplished under the second voltage if the memory module is determined to be unstable.

7. The computing device according to claim 6, wherein the memory module is determined to be stable if the register value is equal to or less than a predefined value, and wherein the memory module is determined to be unstable if the register value is greater than the predefined value.

8. The computing device according to claim 6, wherein the operating voltage of the memory module is adjusted through a basic input output system (BIOS) of the computing device.

9. The computing device according to claim 6, wherein the memory module is an ECC memory module that automatically checks and corrects the memory errors that occurred during the data writing and reading process using an ECC function.

10. The computing device according to claim 6, wherein the register value of the ECC register represents how many memory errors have occurred during the data writing and reading process.

11. A non-transitory storage medium storing a set of instructions, the set of instructions capable of being executed by a processor of a computing device, cause the computing device to perform a memory testing method for testing a memory module of the computing device, the method comprising:

adjusting an operating voltage of the memory module to a first voltage;

writing a predetermined data set into the memory module, and reading out the written data set from the memory module when the operating voltage of the memory module is adjusted to the first voltage, to accomplish a data writing and reading process of the memory module;

adjusting the operating voltage of the memory module to a second value;

writing the data set into the memory module, and reading out the written data set from the memory module when the operating voltage of the memory module is adjusted to the second value;

acquiring a register value of an error checking and correcting (ECC) register of the memory module after the data writing and reading process is accomplished under the second value, wherein: the first voltage is V+Vr, and the second value is V−Vr, V is a nominal operating voltage or a standard operating voltage of the memory module, and Vr is predetermined according to a range within the operating voltage of the memory module;

determining whether the memory module is stable during the adjusting of the operating voltage of the memory module according to the register value; and generating a test result indicating how many memory errors have occurred after the data writing and reading process is accomplished under the second value if the memory module is determined to be unstable.

12. The non-transitory storage medium according to claim 11, wherein the memory module is determined to be stable if the register value is equal to or less than a predefined value, and wherein the memory module is determined to be unstable if the register value is greater than the predefined value.

13. The non-transitory storage medium according to claim 11, wherein the operating voltage of the memory module is adjusted through a basic input output system (BIOS) of the computing device.

14. The non-transitory storage medium according to claim 11, wherein the memory module is an ECC memory module that automatically checks and corrects the memory errors that occurred during the data writing and reading process using an ECC function.

15. The non-transitory storage medium according to claim 11, wherein the register value of the ECC register represents how many memory errors have occurred during the data writing and reading process.

* * * * *